(12) United States Patent
Chung et al.

(10) Patent No.: US 9,825,015 B2
(45) Date of Patent: Nov. 21, 2017

(54) LIGHT-MIXING MULTICHIP PACKAGE STRUCTURE

(71) Applicant: PARAGON SEMICONDUCTOR LIGHTING TECHNOLOGY CO., LTD., New Taipei (TW)

(72) Inventors: Chia-Tin Chung, Miaoli County (TW); Shih-Neng Tai, Taoyuan County (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/150,739

(22) Filed: May 10, 2016

(65) Prior Publication Data

US 2017/0263594 A1    Sep. 14, 2017

(30) Foreign Application Priority Data

Mar. 11, 2016   (TW) .............................. 105107561 A

(51) Int. Cl.
| | |
|---|---|
| *H01L 29/20* | (2006.01) |
| *H01L 25/13* | (2006.01) |
| *H01L 33/60* | (2010.01) |
| *H01L 33/48* | (2010.01) |
| *H01L 33/56* | (2010.01) |

(52) U.S. Cl.
CPC ............ *H01L 25/13* (2013.01); *H01L 33/483* (2013.01); *H01L 33/56* (2013.01); *H01L 33/60* (2013.01)

(58) Field of Classification Search
CPC ....... H01L 25/13; H01L 33/56; H01L 33/483; H01L 33/60; H01L 25/047; H01L 25/041; H01L 25/042; H01L 25/043; H01L 25/065; H01L 25/0652; H01L 25/0655; H01L 25/0657; H01L 25/07; H01L 25/071; F21K 9/00; F21K 9/30
See application file for complete search history.

(56) References Cited

U.S. PATENT DOCUMENTS

2015/0308632 A1*  10/2015  Ueno ........................ F21K 9/30
362/235

* cited by examiner

*Primary Examiner* — Julio J Maldonado
*Assistant Examiner* — Stanetta Isaac
(74) *Attorney, Agent, or Firm* — Li & Cai Intellectual Property (USA) Office

(57) ABSTRACT

A light-mixing multichip package structure includes a circuit substrate, a first light-emitting module, a first package body, a second light-emitting module and a second package body. The first light-emitting module includes a plurality of first light-emitting elements disposed on the circuit substrate and electrically connected to the circuit substrate. The first package body is disposed on the circuit substrate to enclose the first light-emitting elements. The second light-emitting module includes a plurality of second light-emitting elements disposed on the circuit substrate and electrically connected to the circuit substrate, and the first light-emitting module and the first package body are surrounded by the second light-emitting elements. The second package body is disposed on the circuit substrate to enclose the first light-emitting module, the second light-emitting module and the first package body.

10 Claims, 8 Drawing Sheets

LIGHT-MIXING MULTICHIP PACKAGE STRUCTURE

BACKGROUND OF THE INVENTION

1. Field of the Invention

The instant disclosure relates to a multichip package structure, and more particularly to a light-mixing multichip package structure.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One aspect of the instant disclosure relates to a light-mixing multichip package structure.

One of the embodiments of the instant disclosure provides a light-mixing multichip package structure, comprising a circuit substrate, a first light-emitting module, a first package body, a second light-emitting module and a second package body. The first light-emitting module includes a plurality of first light-emitting elements disposed on the circuit substrate and electrically connected to the circuit substrate. The first package body is disposed on the circuit substrate to enclose the first light-emitting elements. The second light-emitting module includes a plurality of second light-emitting elements disposed on the circuit substrate and electrically connected to the circuit substrate, and the first light-emitting module and the first package body are surrounded by the second light-emitting elements. The second package body is disposed on the circuit substrate to enclose the first light-emitting module, the second light-emitting module and the first package body.

More precisely, the light-mixing multichip package structure further comprises a first light-reflecting body surroundingly disposed on the circuit substrate to surround the first light-emitting module by coating. The position of the first package body is restricted by the first light-reflecting body, and the first light-reflecting body is surrounded by the second light-emitting elements. The first package body has a first curved light output surface contacting the first light-reflecting body and separated from the circuit substrate, and the second package body has a second curved light output surface contacting the circuit substrate.

More precisely, the light-mixing multichip package structure further comprises a second light-reflecting body surroundingly disposed on the circuit substrate to surround the first light-emitting module and the second light-emitting module by coating. The position of the second package body is restricted by the second light-reflecting body. The first package body has a first curved light output surface contacting the circuit substrate, and the second package body has a second curved light output surface contacting the second light-reflecting body and separated from the circuit substrate.

More precisely, the light-mixing multichip package structure further comprises a first light-reflecting body and a second light-reflecting body. The first light-reflecting body is surroundingly disposed on the circuit substrate to surround the first light-emitting module by coating, and the second light-reflecting body is surroundingly disposed on the circuit substrate to surround the first light-emitting module and the second light-emitting module by coating. The position of the first package body is restricted by the first light-reflecting body, the first light-reflecting body is surrounded by the second light-emitting elements, and the position of the second package body is restricted by the second light-reflecting body. The first package body has a first curved light output surface contacting the first light-reflecting body and separated from the circuit substrate, and the second package body has a second curved light output surface contacting the second light-reflecting body and separated from the circuit substrate.

Another one of the embodiments of the instant disclosure provides a light-mixing multichip package structure, comprising a circuit substrate, a first light-emitting module, a first package body, a second light-emitting module and a second package body. The first light-emitting module includes a plurality of first light-emitting elements disposed on the circuit substrate and electrically connected to the circuit substrate. The first package body is disposed on the circuit substrate to enclose the first light-emitting elements. The second light-emitting module includes a plurality of second light-emitting elements disposed on the circuit substrate and electrically connected to the circuit substrate, and the first light-emitting module and the first package body are surrounded by the second light-emitting elements. The second package body is disposed on the circuit substrate to enclose the second light-emitting module, and the second package body surrounds the first package body and is tightly connected the first package body.

Therefore, both the color rendering property and the luminosity of the light-mixing multichip package structure of the instant disclosure are increased due to the designs of "the second light-emitting module including a plurality of second light-emitting elements disposed on the circuit substrate and electrically connected to the circuit substrate, the first light-emitting module and the first package body surrounded by the second light-emitting elements, the second package body disposed on the circuit substrate to enclose the first light-emitting module, the second light-emitting module and the first package body" or "the second light-emitting module including a plurality of second light-emitting elements disposed on the circuit substrate and electrically connected to the circuit substrate, the first light-emitting module and the first package body surrounded by the second light-emitting elements, the second package body disposed on the circuit substrate to enclose the second light-emitting module, and the second package body surrounding the first package body and tightly connected the first package body".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are

DETAILED DESCRIPTION OF THE PREFERRED EMBODIMENTS

The embodiments of "a light-mixing multichip package structure" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
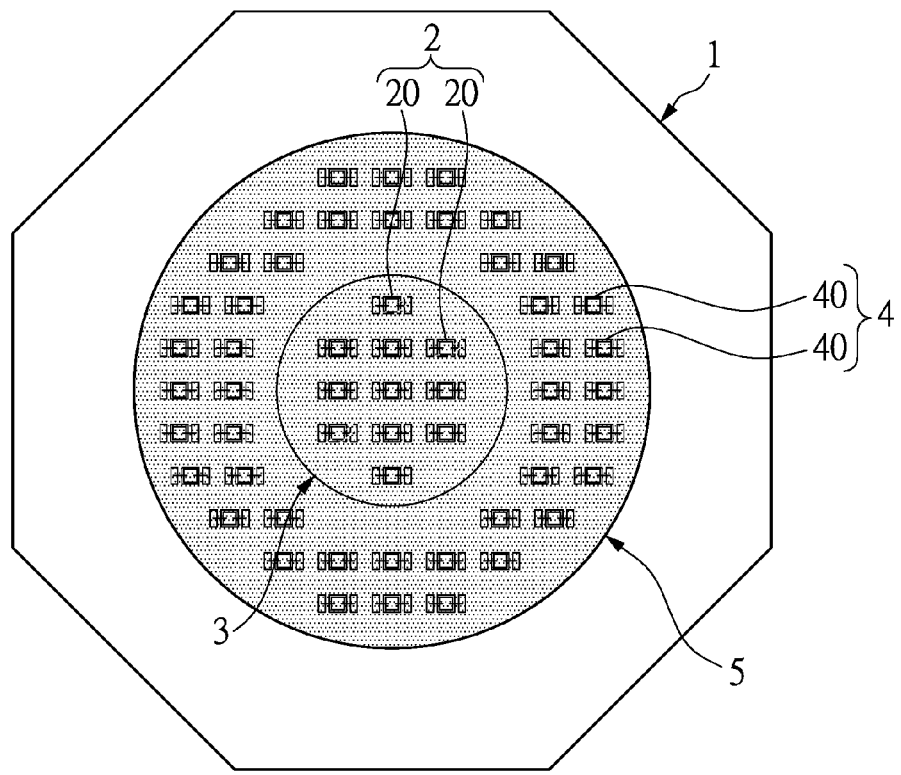
FIG. 1 shows a top, schematic view of the light-mixing multichip package structure according to the first embodiment of the instant disclosure.
Figure 2:
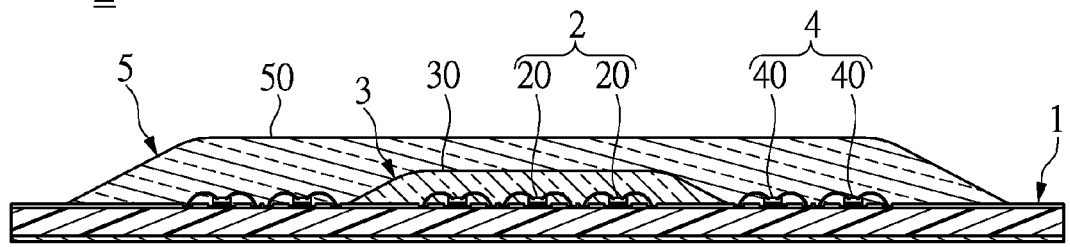
FIG. 2 shows a cross-sectional, schematic view of the light-mixing multichip package structure according to the first embodiment of the instant disclosure.

Referring to FIG. 1 and FIG. 2, the first embodiment of the instant disclosure provides a light-mixing multichip package structure Z, comprising a circuit substrate 1, a first light-emitting module 2, a first package body 3, a second light-emitting module 4 and a second package body 5.

More precisely, the first light-emitting module 2 includes a plurality of first light-emitting elements 20 disposed on the circuit substrate 1 and electrically connected to the circuit substrate 1. The first package body 3 (such as an encapsulation resin or gel body) disposed on the circuit substrate 1 to enclose or encapsulate the first light-emitting elements 20, and the first package body 3 can be restricted on a predetermined position without any light-reflecting body. The second light-emitting module 4 includes a plurality of second light-emitting elements 40 disposed on the circuit substrate 1 and electrically connected to the circuit substrate 1, and the first light-emitting module 2 and the first package body 3 are surrounded or encircled by the second light-emitting elements 40. The second package body 5 (such as an encapsulation resin or gel body) is disposed on the circuit substrate 1 to enclose or encapsulate the first light-emitting module 2, the second light-emitting module 4 and the first package body 3, and the second package body 5 can be restricted on a predetermined position without any light-reflecting body.

For example, each first light-emitting element 20 may be a first LED bare chip (such as a blue or red LED bare chip) for generating a first predetermined color light beam, each second light-emitting element 40 may be a second LED bare chip (such as a blue or red LED bare chip) for generating a second predetermined color light beam, and the first predetermined color light beam generated from the first light-emitting element 20 and the second predetermined color light beam generated from the second light-emitting element 40 are the same or different. In addition, the first package body 3 has a first curved light output surface 30 directly contacting the circuit substrate 1, and the second package body 5 has a second curved light output surface 50 directly contacting the circuit substrate 1, and both the first package body 3 and the second package body 5 can be made of silicone or epoxy resin.

Second Embodiment

Figure 3:
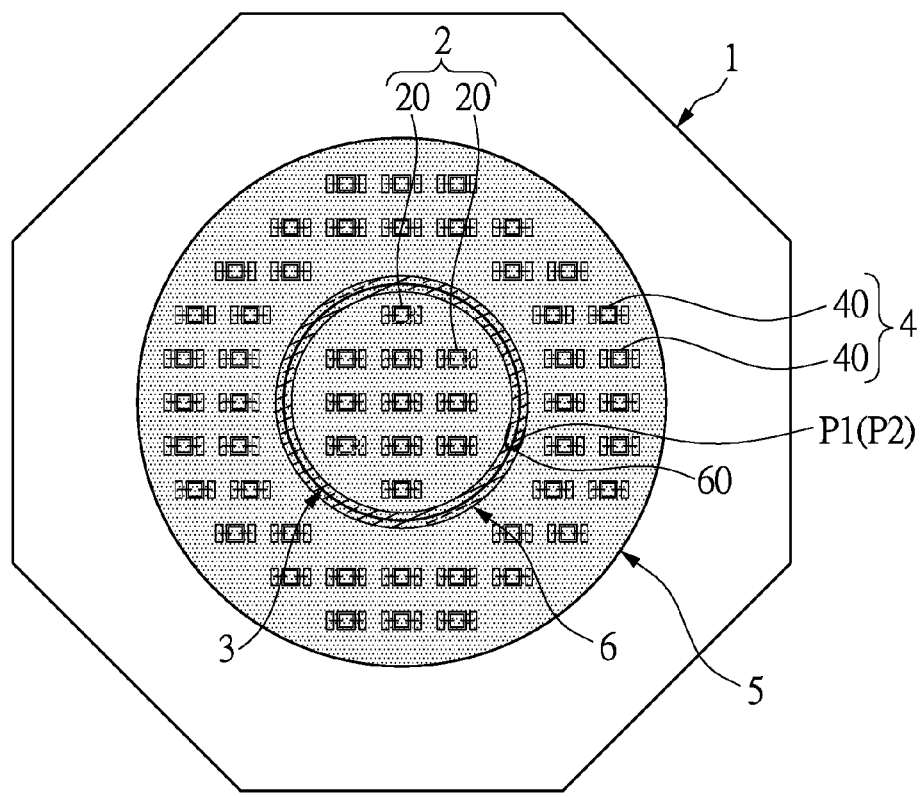
FIG. 3 shows a top, schematic view of the light-mixing multichip package structure according to the second embodiment of the instant disclosure.
Figure 4:
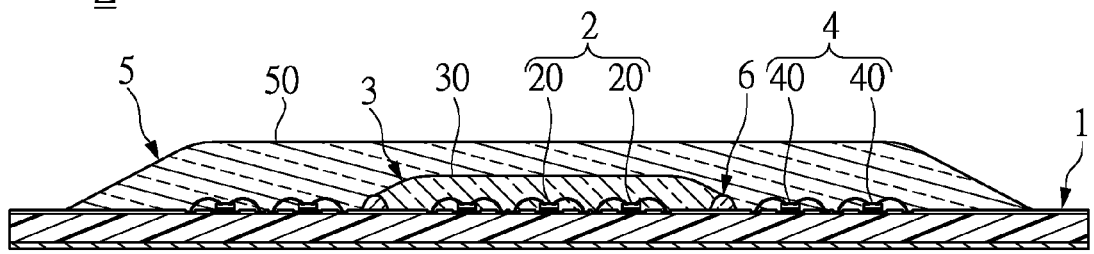
FIG. 4 shows a cross-sectional, schematic view of the light-mixing multichip package structure according to the second embodiment of the instant disclosure.

Referring to FIG. 3 and FIG. 4, the second embodiment of the instant disclosure provides a light-mixing multichip package structure Z, comprising a circuit substrate 1, a first light-emitting module 2, a first package body 3, a second light-emitting module 4 and a second package body 5. As compared with FIG. 1 and FIG. 2, the difference between the second embodiment and the first embodiment is as follows: the light-mixing multichip package structure Z of the second embodiment further comprises a first light-reflecting body 6 (such as a light-reflecting resin or gel body) surroundingly disposed on the circuit substrate 1 to surround the first light-emitting module 2 by coating.

More precisely, the position or the boundary of the first package body 3 is restricted or limited by the first light-reflecting body 6, and the first light-reflecting body 6 is surrounded by the second light-emitting elements 40. In addition, the first package body 3 has a first curved light output surface 30 directly contacting the first light-reflecting body 6 and separated from the circuit substrate 1, and the second package body 5 has a second curved light output surface 50 directly contacting the circuit substrate 1.

For example, the first light-reflecting body 6 is extended from a first coating initial point P1 to a first coating terminal point P2 that is substantially overlapped with the first coating initial point P1, and the first light-reflecting body 6 has a first convex portion 60 or a first concave portion (not shown) disposed on the first coating terminal point P2. In addition, the thixotropic index of the first light-reflecting body 6 has a range between 4 and 6, and the first light-reflecting body 6 is formed by mixing inorganic additive with white thermohardening colloid.

Third Embodiment

Figure 5:
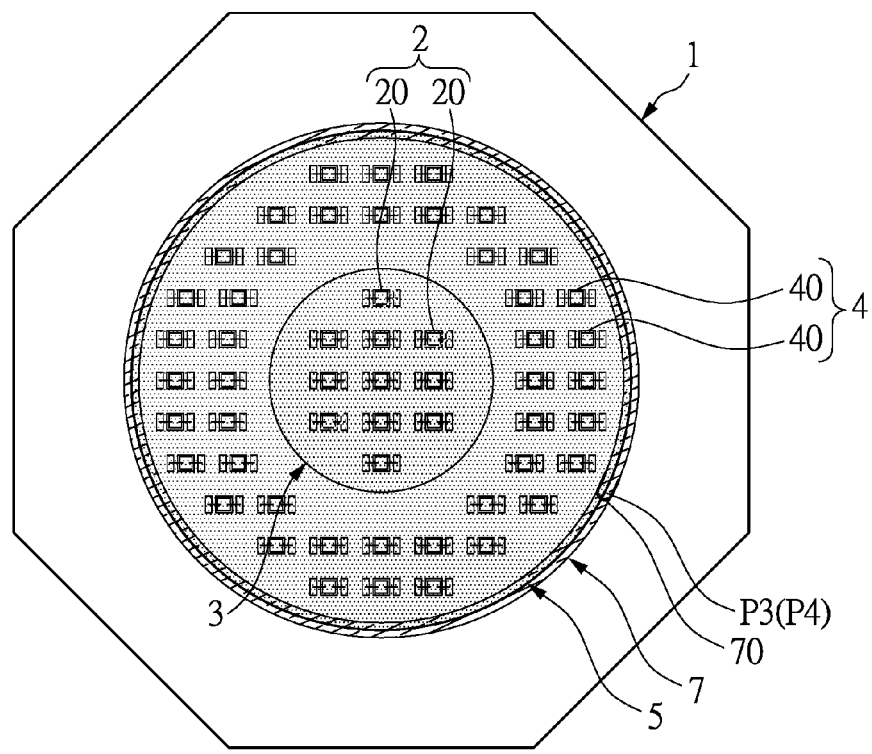
FIG. 5 shows a top, schematic view of the light-mixing multichip package structure according to the third embodiment of the instant disclosure.
Figure 6:
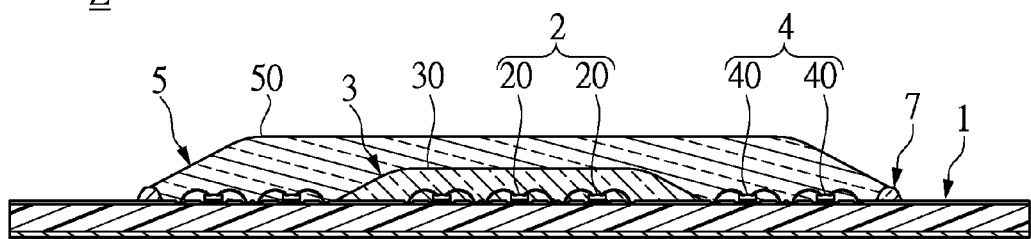
FIG. 6 shows a cross-sectional, schematic view of the light-mixing multichip package structure according to the third embodiment of the instant disclosure.

Referring to FIG. 5 and FIG. 6, the third embodiment of the instant disclosure provides a light-mixing multichip package structure Z, comprising a circuit substrate 1, a first light-emitting module 2, a first package body 3, a second light-emitting module 4 and a second package body 5. As compared with FIG. 1 and FIG. 2, the difference between the third embodiment and the first embodiment is as follows: the light-mixing multichip package structure Z of the third embodiment further comprises a second light-reflecting body 7 (such as a light-reflecting resin or gel body) surroundingly disposed on the circuit substrate 1 to surround the first light-emitting module 2 and the second light-emitting module 4 by coating.

More precisely, the position or the boundary of the second package body 5 is restricted by the second light-reflecting body 7. In addition, the first package body 3 has a first curved light output surface 30 directly contacting the circuit substrate 1, and the second package body 5 has a second curved light output surface 50 directly contacting the second light-reflecting body 7 and separated from the circuit substrate 1.

For example, the second light-reflecting body 7 is extended from a second coating initial point P3 to a second coating terminal point P4 that is substantially overlapped with the second coating initial point P3, and the second light-reflecting body 7 has a second convex portion 70 or a second concave portion (not shown) disposed on the second coating terminal point P4. In addition, the thixotropic index of the second light-reflecting body 7 has a range between 4 and 6, and the second light-reflecting body 7 is formed by mixing inorganic additive with white thermohardening colloid.

Fourth Embodiment

Figure 7:
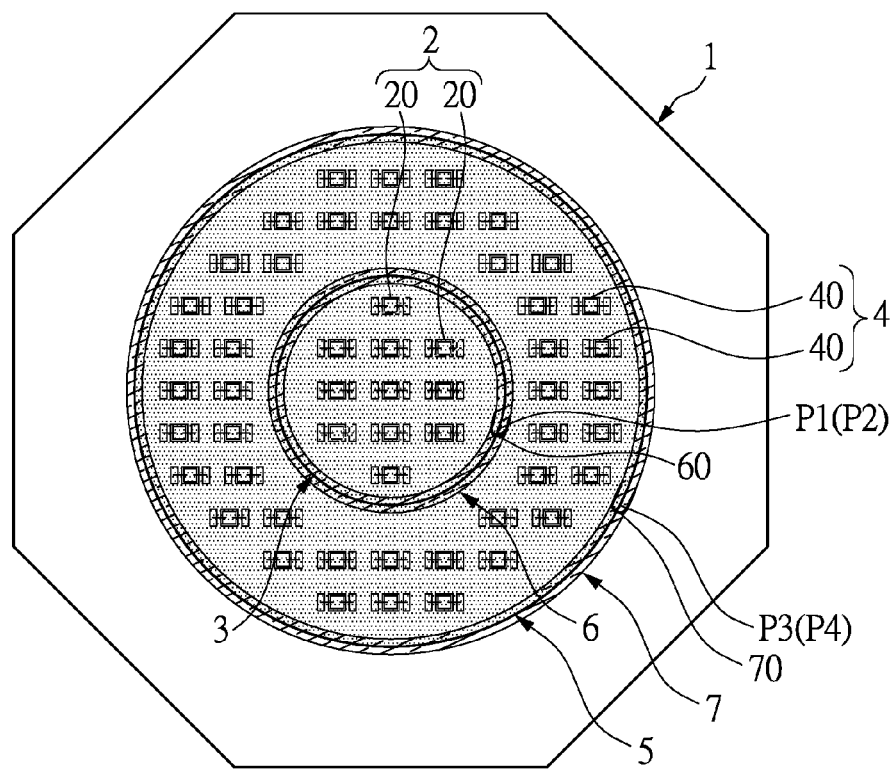
FIG. 7 shows a top, schematic view of the light-mixing multichip package structure according to the fourth embodiment of the instant disclosure.
Figure 8:
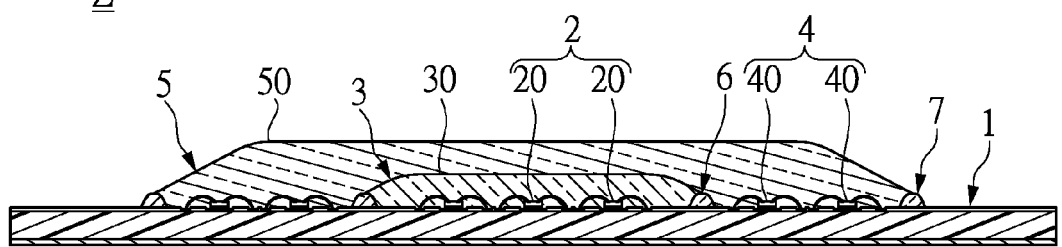
FIG. 8 shows a cross-sectional, schematic view of the light-mixing multichip package structure according to the fourth embodiment of the instant disclosure.

Referring to FIG. 7 and FIG. 8, the fourth embodiment of the instant disclosure provides a light-mixing multichip package structure Z, comprising a circuit substrate 1, a first light-emitting module 2, a first package body 3, a second light-emitting module 4 and a second package body 5. As compared with FIG. 1 and FIG. 2, the difference between the fourth embodiment and the first embodiment is as follows: the light-mixing multichip package structure Z of the fourth embodiment further comprises a first light-reflecting body 6 and a second light-reflecting body 7. The first light-reflecting body 6 is surroundingly disposed on the circuit substrate 1 to surround the first light-emitting module 2 by coating, and the second light-reflecting body 7 is surroundingly disposed on the circuit substrate 1 to surround the first light-emitting module 2 and the second light-emitting module 4 by coating.

More precisely, the position or the boundary of the first package body 3 is restricted by the first light-reflecting body 6, the first light-reflecting body 6 is surrounded by the second light-emitting elements 40, and the position or the boundary of the second package body 5 is restricted by the second light-reflecting body 7. In addition, the first package body 3 has a first curved light output surface 30 directly contacting the first light-reflecting body 6 and separated from the circuit substrate 1, and the second package body 5 has a second curved light output surface 50 directly contacting the second light-reflecting body 7 and separated from the circuit substrate 1.

For one example, the first light-reflecting body 6 is extended from a first coating initial point P1 to a first coating terminal point P2 that is substantially overlapped with the first coating initial point P1, and the first light-reflecting body 6 has a first convex portion 60 or a first concave portion (not shown) disposed on the first coating terminal point P2. In addition, the thixotropic index of the first light-reflecting body 6 has a range between 4 and 6, and the first light-reflecting body 6 is formed by mixing inorganic additive with white thermohardening colloid.

For another example, the second light-reflecting body 7 is extended from a second coating initial point P3 to a second coating terminal point P4 that is substantially overlapped with the second coating initial point P3, and the second light-reflecting body 7 has a second convex portion 70 or a second concave portion (not shown) disposed on the second coating terminal point P4. In addition, the thixotropic index of the second light-reflecting body 7 has a range between 4 and 6, and the second light-reflecting body 7 is formed by mixing inorganic additive with white thermohardening colloid.

Fifth Embodiment

Figure 9:
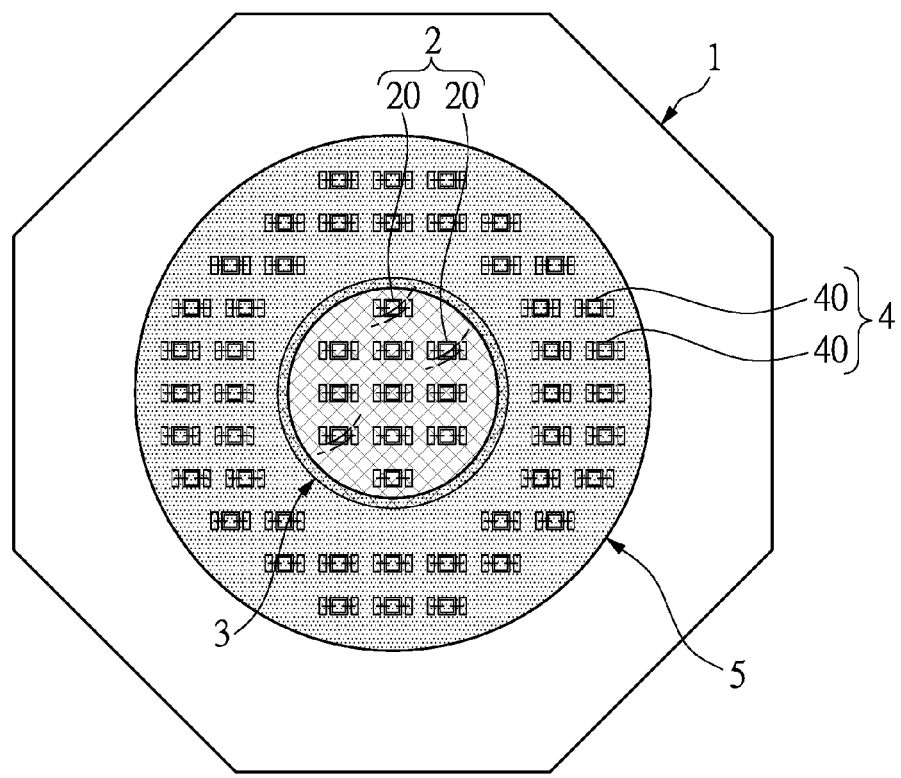
FIG. 9 shows a top, schematic view of the light-mixing multichip package structure according to the fifth embodiment of the instant disclosure.
Figure 10:
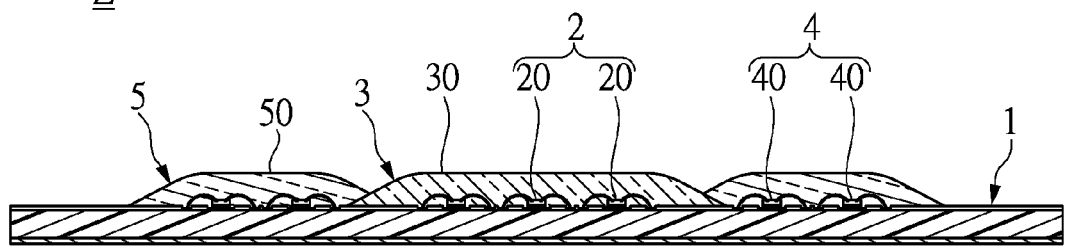
FIG. 10 shows a cross-sectional, schematic view of the light-mixing multichip package structure according to the fifth embodiment of the instant disclosure.

Referring to FIG. 9 and FIG. 10, the fifth embodiment of the instant disclosure provides a light-mixing multichip package structure Z, comprising a circuit substrate 1, a first light-emitting module 2, a first package body 3, a second light-emitting module 4 and a second package body 5.

More precisely, the first light-emitting module 2 includes a plurality of first light-emitting elements 20 disposed on the circuit substrate 1 and electrically connected to the circuit substrate 1. The first package body 3 (such as an encapsulation resin or gel body) disposed on the circuit substrate 1 to enclose or encapsulate the first light-emitting elements 20, and the first package body 3 can be restricted on a predetermined position without any light-reflecting body. The second light-emitting module 4 includes a plurality of second light-emitting elements 40 disposed on the circuit substrate 1 and electrically connected to the circuit substrate 1, and the first light-emitting module 2 and the first package body 3 are surrounded or encircled by the second light-emitting elements 40. The second package body 5 (such as an encapsulation resin or gel body) is disposed on the circuit substrate 1 to enclose or encapsulate the second light-emitting module 4, the second package body 5 surrounds the first package body 3 and is tightly connected the first package body 3, and the second package body 5 can be restricted on a predetermined position without any light-reflecting body.

For example, each first light-emitting element 20 may be a first LED bare chip (such as a blue or red LED bare chip) for generating a first predetermined color light beam, each second light-emitting element 40 may be a second LED bare chip (such as a blue or red LED bare chip) for generating a second predetermined color light beam, and the first predetermined color light beam generated from the first light-emitting element 20 and the second predetermined color light beam generated from the second light-emitting element 40 are the same or different. In addition, the first package body 3 has a first curved light output surface 30 directly contacting the circuit substrate 1, and the second package body 5 has a second curved light output surface 50 directly contacting the circuit substrate 1 and the first package body 3 (that is to say, the second curved light output surface 50 is surroundingly connected to the first package body 3), and both the first package body 3 and the second package body 5 can be made of silicone or epoxy resin.

Sixth Embodiment

Figure 11:
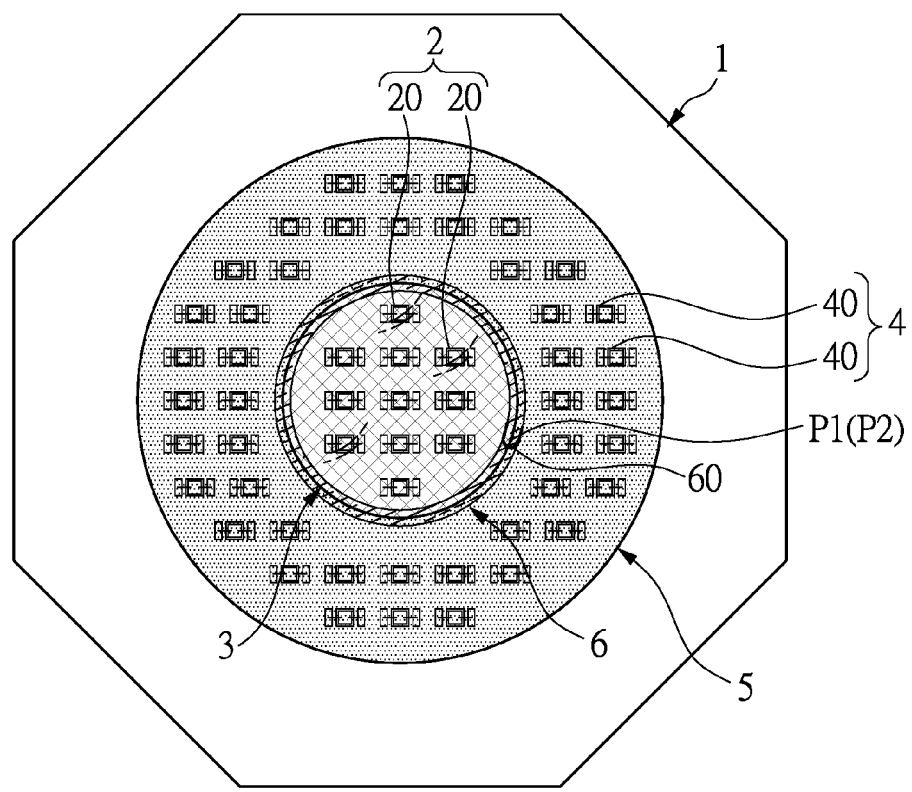
FIG. 11 shows a top, schematic view of the light-mixing multichip package structure according to the sixth embodiment of the instant disclosure.
Figure 12:
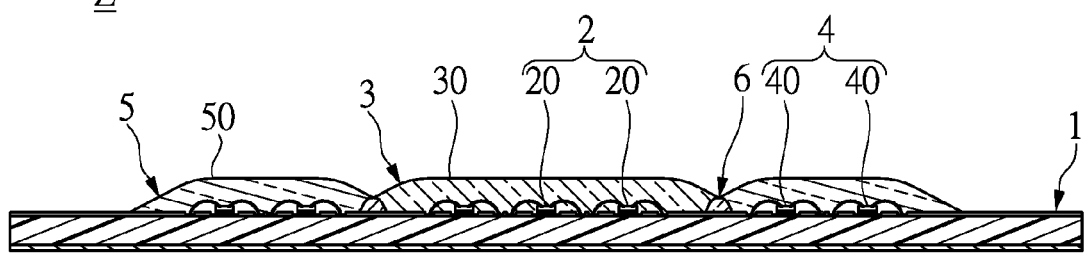
FIG. 12 shows a cross-sectional, schematic view of the light-mixing multichip package structure according to the sixth embodiment of the instant disclosure.

Referring to FIG. 11 and FIG. 12, the sixth embodiment of the instant disclosure provides a light-mixing multichip package structure Z, comprising a circuit substrate 1, a first light-emitting module 2, a first package body 3, a second light-emitting module 4 and a second package body 5. As compared with FIG. 9 and FIG. 10, the difference between the sixth embodiment and the fifth embodiment is as follows: the light-mixing multichip package structure Z of the sixth embodiment further comprises a first light-reflecting body 6 surroundingly disposed on the circuit substrate 1 to surround the first light-emitting module 2 by coating.

More precisely, the position or the boundary of the first package body 3 is restricted or limited by the first light-reflecting body 6, and the first light-reflecting body 6 is surrounded by the second light-emitting elements 40. In addition, the first package body 3 has a first curved light output surface 30 directly contacting the first light-reflecting body 6 and separated from the circuit substrate 1, and the second package body 5 has a second curved light output surface 50 directly contacting the circuit substrate 1 and the first light-reflecting body 6 (that is to say, the second curved light output surface 50 is surroundingly connected to the first light-reflecting body 6).

For example, the first light-reflecting body 6 is extended from a first coating initial point P1 to a first coating terminal point P2 that is substantially overlapped with the first coating initial point P1, and the first light-reflecting body 6 has a first convex portion 60 or a first concave portion (not shown) disposed on the first coating terminal point P2. In addition, the thixotropic index of the first light-reflecting body 6 has a range between 4 and 6, and the first light-reflecting body 6 is formed by mixing inorganic additive with white thermohardening colloid.

Seventh Embodiment

Figure 13:
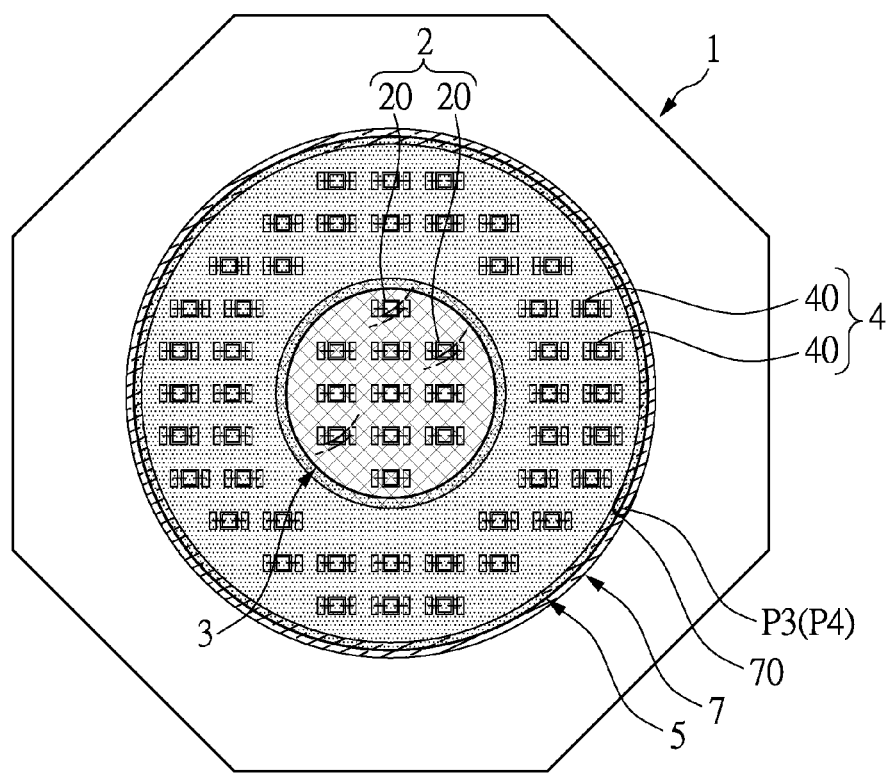
FIG. 13 shows a top, schematic view of the light-mixing multichip package structure according to the seventh embodiment of the instant disclosure.
Figure 14:
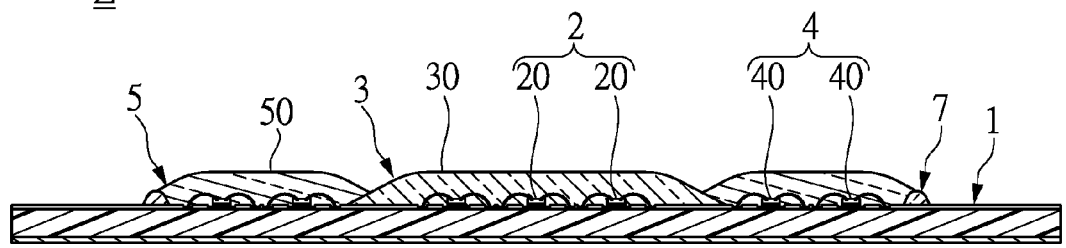
FIG. 14 shows a cross-sectional, schematic view of the light-mixing multichip package structure according to the seventh embodiment of the instant disclosure.

Referring to FIG. 13 and FIG. 14, the seventh embodiment of the instant disclosure provides a light-mixing multichip package structure Z, comprising a circuit substrate 1, a first light-emitting module 2, a first package body 3, a second light-emitting module 4 and a second package body 5. As compared with FIG. 9 and FIG. 10, the difference between the seventh embodiment and the fifth embodiment is as follows: the light-mixing multichip package structure Z of the seventh embodiment further comprises a second light-reflecting body 7 (such as a light-reflecting resin or gel body) surroundingly disposed on the circuit substrate 1 to surround the first light-emitting module 2 and the second light-emitting module 4 by coating.

More precisely, the position or the boundary of the second package body 5 is restricted by the second light-reflecting body 7. In addition, the first package body 3 has a first curved light output surface 30 directly contacting the circuit substrate 1, and the second package body 5 has a second curved light output surface 50 directly contacting the second light-reflecting body 7 and the first package body 3 (that is to say, the second curved light output surface 50 is surroundingly connected to the first package body 3).

For example, the second light-reflecting body 7 is extended from a second coating initial point P3 to a second coating terminal point P4 that is substantially overlapped with the second coating initial point P3, and the second light-reflecting body 7 has a second convex portion 70 or a second concave portion (not shown) disposed on the second coating terminal point P4. In addition, the thixotropic index of the second light-reflecting body 7 has a range between 4 and 6, and the second light-reflecting body 7 is formed by mixing inorganic additive with white thermohardening colloid.

Eighth Embodiment

Figure 15:
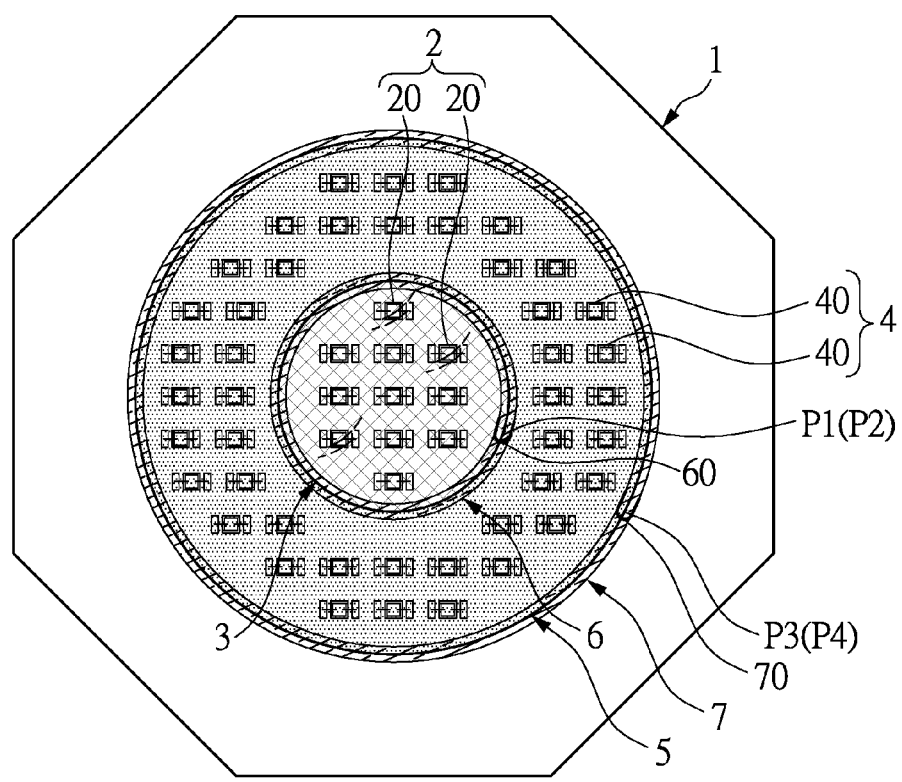
FIG. 15 shows a top, schematic view of the light-mixing multichip package structure according to the eighth embodiment of the instant disclosure.
Figure 16:
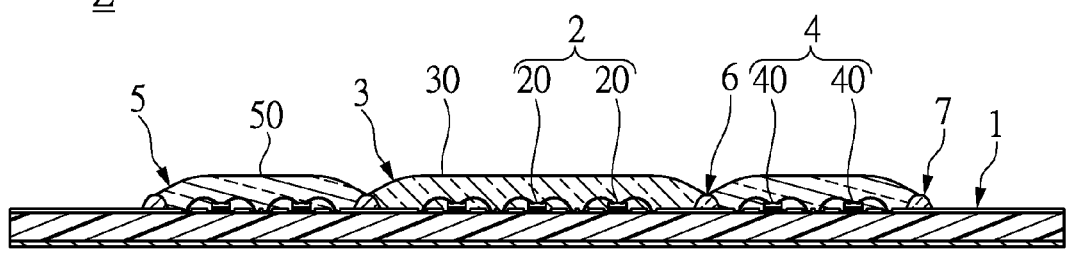
FIG. 16 shows a cross-sectional, schematic view of the light-mixing multichip package structure according to the eighth embodiment of the instant disclosure.

Referring to FIG. 15 and FIG. 16, the eighth embodiment of the instant disclosure provides a light-mixing multichip package structure Z, comprising a circuit substrate 1, a first light-emitting module 2, a first package body 3, a second light-emitting module 4 and a second package body 5. As compared with FIG. 9 and FIG. 10, the difference between the eighth embodiment and the fifth embodiment is as follows: the light-mixing multichip package structure Z of the eighth embodiment further comprises a first light-reflecting body 6 and a second light-reflecting body 7. The first light-reflecting body 6 is surroundingly disposed on the circuit substrate 1 to surround the first light-emitting module 2 by coating, and the second light-reflecting body 7 is surroundingly disposed on the circuit substrate 1 to surround the first light-emitting module 2 and the second light-emitting module 4 by coating.

More precisely, the position or the boundary of the first package body 3 is restricted by the first light-reflecting body 6, the first light-reflecting body 6 is surrounded by the second light-emitting elements 40, and the position or the boundary of the second package body 5 is restricted by the second light-reflecting body 7. In addition, the first package body 3 has a first curved light output surface 30 directly contacting the first light-reflecting body 6 and separated from the circuit substrate 1, and the second package body 5 has a second curved light output surface 50 directly contacting the first light-reflecting body 6 and the second light-reflecting body 7 (that is to say, the second curved light output surface 50 is surroundingly connected to the first light-reflecting body 6).

For one example, the first light-reflecting body 6 is extended from a first coating initial point P1 to a first coating terminal point P2 that is substantially overlapped with the first coating initial point P1, and the first light-reflecting body 6 has a first convex portion 60 or a first concave portion (not shown) disposed on the first coating terminal point P2. In addition, the thixotropic index of the first light-reflecting body 6 has a range between 4 and 6, and the first light-reflecting body 6 is formed by mixing inorganic additive with white thermohardening colloid.

For another example, the second light-reflecting body 7 is extended from a second coating initial point P3 to a second coating terminal point P4 that is substantially overlapped with the second coating initial point P3, and the second light-reflecting body 7 has a second convex portion 70 or a second concave portion (not shown) disposed on the second coating terminal point P4. In addition, the thixotropic index of the second light-reflecting body 7 has a range between 4 and 6, and the second light-reflecting body 7 is formed by mixing inorganic additive with white thermohardening colloid.

In conclusion, both the color rendering property and the luminosity of the light-mixing multichip package structure Z of the instant disclosure are increased due to the designs of "the second light-emitting module 4 including a plurality of second light-emitting elements 40 disposed on the circuit substrate 1 and electrically connected to the circuit substrate 1, the first light-emitting module 2 and the first package body 3 surrounded by the second light-emitting elements 40, the second package body 5 disposed on the circuit substrate 1 to enclose the first light-emitting module 2, the second light-emitting module 4 and the first package body 3" or "the second light-emitting module 4 including a plurality of second light-emitting elements 40 disposed on the circuit substrate 1 and electrically connected to the circuit substrate 1, the first light-emitting module 2 and the first package body 3 surrounded by the second light-emitting elements 40, the second package body 5 disposed on the circuit substrate 1 to enclose the second light-emitting module 4, and the second package body 5 surrounding the first package body 3 and tightly connected the first package body 3".

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A light-mixing multichip package structure, comprising:
    a circuit substrate;
    a first light-emitting module including a plurality of first light-emitting elements disposed on the circuit substrate and electrically connected to the circuit substrate;
    a first package body disposed on the circuit substrate to enclose the first light-emitting elements;
    a second light-emitting module including a plurality of second light-emitting elements disposed on the circuit substrate and electrically connected to the circuit substrate, wherein the first light-emitting module and the first package body are surrounded by the second light-emitting elements; and
    a second package body disposed on the circuit substrate to enclose the first light-emitting module, the second light-emitting module and the first package body.

2. The light-mixing multichip package structure of claim 1, wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different, wherein the first package body has a first curved light output surface contacting the circuit substrate, and the second package body has a second curved light output surface contacting the circuit substrate.

3. The light-mixing multichip package structure of claim 1, further comprising:
    a first light-reflecting body surroundingly disposed on the circuit substrate to surround the first light-emitting module by coating;
    wherein the position of the first package body is restricted by the first light-reflecting body, and the first light-reflecting body is surrounded by the second light-emitting elements;
    wherein the first light-reflecting body is extended from a first coating initial point to a first coating terminal point that is overlapped with the first coating initial point, and the first light-reflecting body has a first convex portion disposed on the first coating terminal point;
    wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different;
    wherein the first package body has a first curved light output surface contacting the first light-reflecting body and separated from the circuit substrate, and the second package body has a second curved light output surface contacting the circuit substrate.

4. The light-mixing multichip package structure of claim 1, further comprising:
    a second light-reflecting body surroundingly disposed on the circuit substrate to surround the first light-emitting module and the second light-emitting module by coating;
    wherein the position of the second package body is restricted by the second light-reflecting body;
    wherein the second light-reflecting body is extended from a second coating initial point to a second coating terminal point that is overlapped with the second coating initial point, and the second light-reflecting body has a second convex portion disposed on the second coating terminal point;
    wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different;
    wherein the first package body has a first curved light output surface contacting the circuit substrate, and the second package body has a second curved light output surface contacting the second light-reflecting body and separated from the circuit substrate.

5. The light-mixing multichip package structure of claim 1, further comprising:
    a first light-reflecting body surroundingly disposed on the circuit substrate to surround the first light-emitting module by coating; and
    a second light-reflecting body surroundingly disposed on the circuit substrate to surround the first light-emitting module and the second light-emitting module by coating;
    wherein the position of the first package body is restricted by the first light-reflecting body, the first light-reflecting body is surrounded by the second light-emitting elements, and the position of the second package body is restricted by the second light-reflecting body;

wherein the first light-reflecting body is extended from a first coating initial point to a first coating terminal point that is overlapped with the first coating initial point, and the first light-reflecting body has a first convex portion disposed on the first coating terminal point;

wherein the second light-reflecting body is extended from a second coating initial point to a second coating terminal point that is overlapped with the second coating initial point, and the second light-reflecting body has a second convex portion disposed on the second coating terminal point;

wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different;

wherein the first package body has a first curved light output surface contacting the first light-reflecting body and separated from the circuit substrate, and the second package body has a second curved light output surface contacting the second light-reflecting body and separated from the circuit substrate.

6. A light-mixing multichip package structure, comprising:
a circuit substrate;
a first light-emitting module including a plurality of first light-emitting elements disposed on the circuit substrate and electrically connected to the circuit substrate;
a first package body disposed on the circuit substrate to enclose the first light-emitting elements;
a second light-emitting module including a plurality of second light-emitting elements disposed on the circuit substrate and electrically connected to the circuit substrate, wherein the first light-emitting module and the first package body are surrounded by the second light-emitting elements; and
a second package body disposed on the circuit substrate to enclose the second light-emitting module, wherein the second package body surrounds the first package body and is tightly connected to the first package body.

7. The light-mixing multichip package structure of claim 6, wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different, wherein the first package body has a first curved light output surface contacting the circuit substrate, and the second package body has a second curved light output surface contacting the circuit substrate and the first package body.

8. The light-mixing multichip package structure of claim 6, further comprising:
a first light-reflecting body surroundingly disposed on the circuit substrate to surround the first light-emitting module by coating;

wherein the position of the first package body is restricted by the first light-reflecting body, and the first light-reflecting body is surrounded by the second light-emitting elements;

wherein the first light-reflecting body is extended from a first coating initial point to a first coating terminal point that is overlapped with the first coating initial point, and the first light-reflecting body has a first convex portion disposed on the first coating terminal point;

wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different;

wherein the first package body has a first curved light output surface contacting the first light-reflecting body and separated from the circuit substrate, and the second package body has a second curved light output surface contacting the circuit substrate and the first light-reflecting body.

9. The light-mixing multichip package structure of claim 6, further comprising:
a second light-reflecting body surroundingly disposed on the circuit substrate to surround the first light-emitting module and the second light-emitting module by coating;

wherein the position of the second package body is restricted by the second light-reflecting body;

wherein the second light-reflecting body is extended from a second coating initial point to a second coating terminal point that is overlapped with the second coating initial point, and the second light-reflecting body has a second convex portion disposed on the second coating terminal point;

wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different;

wherein the first package body has a first curved light output surface contacting the circuit substrate, and the second package body has a second curved light output surface contacting the second light-reflecting body and the first package body.

10. The light-mixing multichip package structure of claim 6, further comprising:
a first light-reflecting body surroundingly disposed on the circuit substrate to surround the first light-emitting module by coating; and
a second light-reflecting body surroundingly disposed on the circuit substrate to surround the first light-emitting module and the second light-emitting module by coating;

wherein the position of the first package body is restricted by the first light-reflecting body, the first light-reflecting body is surrounded by the second light-emitting elements, and the position of the second package body is restricted by the second light-reflecting body;

wherein the first light-reflecting body is extended from a first coating initial point to a first coating terminal point that is overlapped with the first coating initial point, and the first light-reflecting body has a first convex portion disposed on the first coating terminal point;

wherein the second light-reflecting body is extended from a second coating initial point to a second coating terminal point that is overlapped with the second coating initial point, and the second light-reflecting body has a second convex portion disposed on the second coating terminal point;

wherein each first light-emitting element is a first LED bare chip for generating a first predetermined color light beam, each second light-emitting element is a second LED bare chip for generating a second predetermined color light beam, and the first predetermined color light beam generated from the first light-emitting element and the second predetermined color light beam generated from the second light-emitting element are the same or different;

wherein the first package body has a first curved light output surface contacting the first light-reflecting body and separated from the circuit substrate, and the second package body has a second curved light output surface contacting the first light-reflecting body and the second light-reflecting body.

* * * * *